US008384403B2

(12) United States Patent
Zollner et al.

(10) Patent No.: US 8,384,403 B2

(45) Date of Patent: Feb. 26, 2013

(54) METHOD AND DEVICE FOR DETECTING ELECTRIC POTENTIAL AND ELECTRIC CHARGES IN A PRINTER OR COPIER

(75) Inventors: Alfred Zollner, Eitting (DE); Markus Jeschonek, Erding (DE)

(73) Assignee: Océ Printing Systems GmbH, Poing (DE)

( * ) Notice: Subject to any disclaimer, the term of this patent is extended or adjusted under 35 U.S.C. 154(b) by 715 days.

(21) Appl. No.: 12/528,106

(22) PCT Filed: Feb. 20, 2008

(86) PCT No.: PCT/EP2008/052060

§ 371 (c)(1), (2), (4) Date: Aug. 21, 2009

(87) PCT Pub. No.: WO2008/101954

PCT Pub. Date: Aug. 28, 2008

(65) Prior Publication Data

US 2010/0321047 A1 Dec. 23, 2010

(30) Foreign Application Priority Data

Feb. 23, 2007 (DE) ......................... 10 2007 009 070

(51) Int. Cl.
*G01R 27/26* (2006.01)

(52) U.S. Cl. ........................................ 324/699; 324/713

(58) Field of Classification Search .................. 324/699, 324/713

See application file for complete search history.

(56) References Cited

U.S. PATENT DOCUMENTS

| | | | |
|---|---|---|---|
| 3,918,395 | A | 11/1975 | Fearnside |
| 4,639,117 | A | 1/1987 | Murai et al. |
| 5,250,988 | A | 10/1993 | Matsuura et al. |
| 5,329,339 | A | 7/1994 | Sakamoto et al. |
| 5,689,763 | A | 11/1997 | Rathbun et al. |

(Continued)

FOREIGN PATENT DOCUMENTS

| | | |
|---|---|---|
| DE | 3240943 | 5/1983 |
| DE | 43 36 690 A1 | 5/1995 |

(Continued)

OTHER PUBLICATIONS

Digital Printing Technology and Printing Techniques of Océ Digital Printing Presses—Feb. 2005.

(Continued)

*Primary Examiner* — Vincent Q Nguyen

(74) *Attorney, Agent, or Firm* — Schiff Hardin LLP

(57) ABSTRACT

In a system or method to detect an electrical potential and layer thickness of a layer of toner particles in a printer or copier, a measurement arrangement is provided having a first electrode and at least one second electrode situated opposite the first electrode. An intermediate image carrier is provided on a surface of which a toner image is generated. A drive unit drives the intermediate image carrier so that its surface is directed past the first electrode situated opposite the surface. An evaluation unit is electrically connected with the first electrode. The evaluation unit detects an electrical current flowing between the first electrode and the evaluation unit. The evaluation unit determines an electrical charge of toner particles arranged in a detection region in a first measurement procedure with aid of the detected current. The evaluation unit also determines the layer thickness of the layer of toner particles in an inked region via at least one second measurement procedure.

15 Claims, 6 Drawing Sheets

U.S. PATENT DOCUMENTS

| | | | | |
|---|---|---|---|---|
| 5,950,042 | A | 9/1999 | Goto | |
| 6,034,703 | A | 3/2000 | Broddin et al. | |
| 6,081,677 | A | 6/2000 | Maess et al. | |
| 6,173,134 | B1 | 1/2001 | Nishimura et al. | |
| 6,486,680 | B1 | 11/2002 | Mull | |
| 6,771,913 | B2 * | 8/2004 | Jeschonek et al. | 399/49 |
| 7,016,620 | B2 | 3/2006 | Maess et al. | |
| 7,218,872 | B2 * | 5/2007 | Shimomura | 399/55 |
| 2001/0033755 | A1 | 10/2001 | Ino et al. | |
| 2003/0091355 | A1 | 5/2003 | Jeschonek et al. | |
| 2005/0286916 | A1 | 12/2005 | Nakazato et al. | |

FOREIGN PATENT DOCUMENTS

| | | | |
|---|---|---|---|
| DE | 196 43 611 | A1 | 4/1998 |
| DE | 10136259 | | 2/2003 |
| DE | 101 51 702 | A1 | 5/2003 |
| DE | 101 51 703 | A1 | 5/2003 |
| EP | 0535655 | | 4/1993 |
| JP | 05333647 | | 12/1993 |
| JP | 06130768 | A | 5/1994 |
| JP | 2006-72072 | | 3/2006 |
| JP | 2006-74985 | | 3/2006 |
| WO | WO 91/18287 | | 11/1991 |
| WO | 9806011 | | 2/1998 |

OTHER PUBLICATIONS

Digitaldruck—Feb. 2005.

* cited by examiner

State 0 = First switch state of the cross-over switches 46, 48
State 1 = First switch state of the cross-over switches 46, 48

METHOD AND DEVICE FOR DETECTING ELECTRIC POTENTIAL AND ELECTRIC CHARGES IN A PRINTER OR COPIER

RELATED APPLICATION

The present application is related to U.S. Ser. No. 12/517,709 titled: "Method And Arrangement For Setting The Dot Size Of Printed Images Generated With The Aid Of An Electrographic Printing Or Copying System", filed Jun. 4, 2009, the inventors of which are Thomas Schwarz-Kock and Ralph Dorfner.

BACKGROUND

The preferred embodiment concerns a method and a device to detect an electrical potential and electrical charges, in which a capacitive sensor that has a first electrode or at least one second electrode situated opposite the first electrode is used as a measurement arrangement. A toner or charge image is generated on the generated surface of an endless intermediate image carrier. A drive unit drives the intermediate image carrier so that the generated surface is directed in a revolving manner past the first electrode situated opposite the generated surface. The first electrode is electrically connected with an evaluation unit that evaluates the measurement signals of the measurement arrangement. The second electrode can in particular be formed by a low-resistance, electrically conductive layer of the intermediate image carrier that is advantageously connected with a reference potential of the printer or copier.

Known devices in electrographic printers or copiers that use a capacitive sensor as a measurement arrangement are in particular used to detect the layer thickness of a toner particle layer and the moisture content of a carrier material. Such a device and an associated measurement method are known from the document DE 101 51703 A1.

A device and a method to continuously control the bias voltage of an electrographic developer unit are known from the document U.S. Pat. No. 3,918,395, in which a measurement arrangement is used that has an electrically conductive plate situated opposite the generated surface of a photoconductor. A voltage that is used to set the bias voltage is induced upon passage of the electrostatic image.

Potential sensors to determine the charge of a photoconductor that have an electrode situated opposite the generated surface of the photoconductor are known from the document WO 91/18287 and from the document DE P 43 36 690 C2.

The content of the cited documents is herewith incorporated by reference into the present Specification.

Additional measurement arrangements for the examination of a toner mark are known from the documents U.S. Pat. No. 5,689,763, DE-A-10151703, JP-A-06130768, DE-A-4336690, JP-A-2006072072 and JP-A-06074985. At least three potential sensors that respectively determine the potential of a toner layer are provided for this in the document JP-A-06130768. From the document U.S. Pat. No. 5,689,763 it is known to determine both the potential and the layer thickness of a colorant layer in a single measurement procedure. The evaluation of the measurement signal determined in the measurement procedure is thereby relatively complicated.

In the prior art known from the document DE-A-4336690, a potential measurement is conducted with the aid of a single sensor. The sensor has a knife-shaped electrode. This electrode is arranged perpendicular to a surface inked with toner particles.

In the prior art known from the document JP-A-2006072072, a measurement arrangement with multiple sensors is used. A first sensor is provided to determine the toner density, and a second sensor is provided to determine the potential of the toner particle layer.

In the prior art known from the document JP-A-06074985, the potential of a toner particle layer is determined with the aid of a first measurement determination. A laser distance measurement to determine the layer thickness of the toner particle layer is conducted via an additional, independent measurement device.

SUMMARY

It is an object to specify a device and a method via which an electrical potential and electrical charges in a printer or copier can be determined in a simple manner.

In a system or method to detect an electrical potential and layer thickness of a layer of toner particles in a printer or copier, a measurement arrangement is provided having a first electrode and at least one second electrode situated opposite the first electrode. An intermediate image carrier is provided on a surface of which a toner image is generated. A drive unit drives the intermediate image carrier so that its surface is directed past the first electrode situated opposite the surface. An evaluation unit is electrically connected with the first electrode. The evaluation unit detects an electrical current flowing between the first electrode and the evaluation unit. The evaluation unit determines an electrical charge of toner particles arranged in a detection region in a first measurement procedure with aid of the detected current. The evaluation unit also determines the layer thickness of the layer of toner particles in an inked region via at least one second measurement procedure.

DESCRIPTION OF THE PREFERRED EMBODIMENTS

Figure 1:
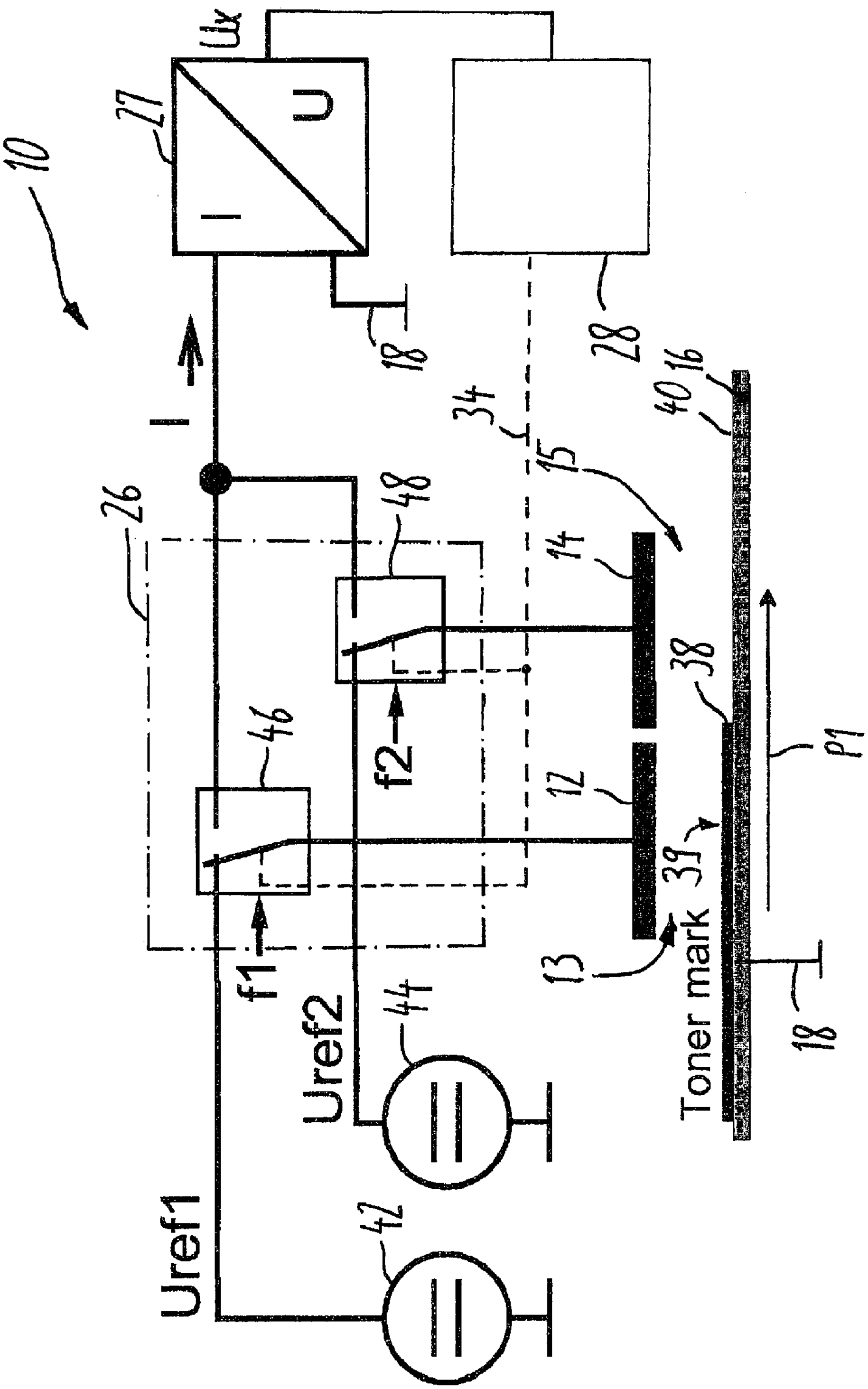
FIG. 1 is a schematic representation of the design of a measurement arrangement to determine the layer thickness of a toner mark and the electrical charge of the toner particles of the toner mark with the aid of a capacitive measurement method.

For the purposes of promoting an understanding of the principles of the invention, reference will now be made to the preferred embodiments/best mode illustrated in the drawings and specific language will be used to describe the same. It will nevertheless be understood that no limitation of the scope of the invention is thereby intended, and such alterations and further modifications in the illustrated device and method, and such further applications of the principles of the invention as illustrated as would normally occur to one skilled in the art to which the invention relates are included.

With aid of the electrical current detected by the evaluation unit, the electrical potential of the generated surface of the intermediate image carrier in a detection region situated opposite the first electrode and/or the charge of toner particles arranged in a detection region can be repeatedly determined in a simple manner. Potential changes and charge changes can thereby be determined. The determined potential change can be used to set the charge potential and/or a discharge potential of a photoconductor. Given a deviation of the determined electrical charge from a predetermined desired charge, with information about the electrical charge of the toner particles of an inked toner image an intervention can be made in a simple manner in the electrographic image generation process in order to keep the print quality of a generated print image consistently high and to compensate for the degradation of the print quality (resulting from the deviation of the actual, determined charge from the preset desired charge) via a variation of other parameters of the image generation process. Alternatively or additionally, measures can be taken in order to improve the charge state of the toner particles, i.e. to increase the electrical charge of the toner particles. In particular, it can occur by resupplying additional toner from a toner reservoir into the developer unit and the (possibly necessary) removal of toner material with an unwanted or insufficient charge, for example via the targeted printing of print images fully inked with toner to generate high toner consumption.

The method according to the preferred embodiment for the detection of an electrical potential and electrical charges in a printer or copier has the same advantages as the device therefore.

A measurement arrangement 10 to detect a toner mark 39 generated as a toner particle layer 38 with the aid of an electrographic image generation process is shown in FIG. 1. This measurement arrangement 10 is used in an electrographic printer or copier to detect the inking of the print image and/or the point size of raster points inked with toner particles. The average layer thickness of a toner mark 39 present in the detection region of the measurement arrangement 10 is detected with the aid of the measurement arrangement 10.

The toner mark 39 has a homogeneous print image with a uniform inking pattern, with a complete inking or with a defined incomplete inking. The toner layer 38 of the toner mark 39 has been generated as a latent raster image in the form of a charge image with the aid of a character generator (for example an LED character generator or a laser character generator) on a photoconductor belt 16 charged with the aid of a charging device, for example a corotron device. This latent raster image has subsequently been developed with the aid of a developer unit (not shown) in that the regions to be inked have been inked with the aid of the toner particles provided by the developer unit to ink the latent raster image.

The development of the latent raster image with toner particles advantageously occurs with the aid of what is known as tribo-jump development, in which electrically charged toner particles provided by the developer unit are transferred, via the force exerted by an electrical field at said developer unit in the direction of the regions of the latent raster image that are to be inked, from said developer unit to these regions that are to be inked. The voltage required to generate the electrical field is also designated as a bias voltage. It is particularly advantageous when a layer of toner particles with a substantially constant layer thickness is provided by the developer unit, which layer is then transferred via the bias voltage only to the regions to be inked. The intensity of the inking effect can be controlled in a simple manner via the setting of a suitable bias voltage.

An additional electrical field that exerts a force on the toner particles in the direction of the developer unit so that no toner particles are transferred from the developer unit to the regions of the photoconductor belt 16 that are not to be inked is generated by the bias voltage between the regions of the latent raster image that are not to be inked and the developer unit. A schematic of a tribo-jump developer unit is shown and described as an example on Page 222 in FIG. 8.22 in the document "Digital Printing—Technology and printing techniques of Océ digital printing presses", 9th Edition, February 2005; ISBN 3-00-001081-5.

The developer unit is advantageously executed such that it can be switched, such that the developer unit develops a charge image with toner particles in a first switch state and transfers toner particles to the regions of the charge image that are to be inked with toner particles, and in a second switch state independent of the charge image transfers no toner particles onto the photoconductor belt 16.

The photoconductor belt 16 is a revolving endless belt that is directed with the aid of deflection rollers (not shown). The photoconductor belt 16 contains electrically conductive components that are connected in an electrically conductive manner with a reference potential 18. The toner layer 38 of the generated toner marks 39 as well as toner layers of print images are arranged on the generated surface 40 of the photoconductor belt 16. A first electrode 12 and a second electrode 14 (which are designed as plate-shaped electrodes 12, 14 in the exemplary embodiment) are arranged parallel to the generated surface 40. The active surfaces of the electrodes 12, 14 and the photoconductor belt 16 (serving as a counter-electrode) are facing towards one another, wherein the first and the second electrode 12 and 14 advantageously have the same active area. The first electrode 12 and the counter-electrode form a first capacitor 13, and the second electrode 14 and the counter-electrode form a second capacitor 15. Given the same active area of the electrodes 12, 14 and an identical distance of the electrodes 12, 14 from the counter-electrode, the first capacitor 13 and the second capacitor 15 have the same capacitance if no toner layer 38 and no toner residues or the same toner quantity are present between the photoconductor belt 16 and the electrode 14. The distance between photoconductor belt 16 and the electrode is preset to a value in the range from 0.2 to 10 mm. This distance is advantageously approximately 1 mm.

The measurement arrangement 10 additionally has a switching unit 26 with crossover switches 46, 48. In a first operating mode of the measurement arrangement 10, in a first switching state the crossover switches 46, 48 connect the electrode 12 with a voltage source 42 that is positive relative to the reference potential 18 and the electrode 14 with a voltage source 44 that is negative relative to the reference potential 18. The magnitudes of the voltages provided by the voltage sources are advantageously equal. The magnitude of the positive voltage output by the voltage source 42 is +10 V, for example, and the negative voltage output by the voltage source 44 is −10 V, for example, relative to the reference potential 18. The mentioned first operating mode of the measurement arrangement 10 serves to determine the layer thickness of the toner particle layer 38 and/or to determine the areal coverage of the toner particle layer 38 in toner marks 39 that are not completely inked, in particular to set the dot size of individual pixels in the print image or to set the line width.

A second operating mode of the measurement arrangement 10 serves to determine the charge of the toner particles of the toner particle layer 38, wherein the toner particle layer 38 to determine the charge is advantageously a completely inked toner mark 39 with a known, uniform layer thickness or a known, non-uniform layer thickness. The potential of the photoconductor belt 16 and a potential change between different charged and discharged regions can also be determined in the second operating mode. In the second operating mode, the voltage sources 42, 44 are advantageously switched so that they both have a positive direct voltage of 10 V (for example) in relation to the reference potential 18. The magnitudes of the direct voltages to be provided by the voltage sources 42, 44 in the first operating mode and second operating mode are in particular dependent on the shape and the active area of the electrodes 12, 14 and the distance of the electrodes 12, 14 relative to the counter-electrode.

In a second switching state, in both the first operating mode and the second operating mode the switching unit 26 separates the connections to the voltage sources 42, 44 with the aid of the crossover switches 46, 48, shorts the two electrodes 12, 14 and establishes an electrical connection between the shorted electrodes 12, 14 and the evaluation unit 24. In the described exemplary embodiment, the charge difference of the capacitors 13, 15 is thereby determined and supplied to the evaluation unit 24 in the first operating mode and the charge sum of the capacitors 13, 15 is determined and supplied to the evaluation unit 24. A sampling of a measurement value respectively occurs via the switching into the second switch state. This sampled measurement value is supplied to a current-voltage converter 27 that converts the current flow I produced by the scanned measurement signal into a voltage Ux. This voltage Ux is supplied as a measurement signal to an evaluation unit 28.

A clock signal 34 of a clock signal emitter of the evaluation unit 28 is supplied to the switching unit 26. The clock frequency of the clock signal 34, and thus the switching frequency f1, f2 of the crossover switches 46, 48 of the switching unit 26 for switching between the two switch states, advantageously lies in a range between 300 Hz and 1 MHz. A pulse-pause ratio that is suitable for the respective operating mode or a suitable sampling ratio of the clock signal 34 is subsequently explained in detail in connection with FIG. 7.

The switching over of the capacitors 13, 15 as a result of the switch states of the crossover switches 46, 48 is also designated as a switched capacitor technique. Additional details regarding the design and further embodiments of the measurement arrangement 10 are known from the document DE 101 51 703 A1 and the parallel U.S. Pat. No. 6,771,913 B2, the content of which is herewith incorporated by reference into the present specification.

The evaluation unit 28 can have a filter, for example, advantageously a low-pass filter, and a downstream amplifier, and alternatively or additionally an integrating circuit. A measurement signal generated by the evaluation unit 28 is supplied for additional processing to an additional control unit of the printer or copier. If, as already mentioned, a filter in the evaluation unit 28 is used for evaluation, the filter type and the required filter parameters of the filter can thus be preset depending on the switching frequency and the scanning frequency resulting from this.

If the toner particle layer 38 of the toner mark 39 is transported through the air gaps of the capacitors 13, 15 onto the photoconductor belt 16 in the direction of arrow P1, at every sampling point in time or at every switching point in time the capacitance difference of the two capacitors 13, 15 is determined in the second switch state in the first operating mode and the sum of the capacitances of the capacitors 13, 15 is determined in the second operating mode. The capacitances of the capacitors 13, 15, which without toner marks are identical in the detection region of the measurement arrangement 10, change when toner particles are present in the region between the respective electrode 12, 14 and the counter-electrode since the toner particles have a different permittivity than the air that is otherwise exclusively present between the electrodes 12/16, 14/16. In the first operating mode, the layer thickness of the toner particle layer that is or would be present on the active surface of the respective capacitor 13, 15 given a uniform distribution of the toner particles present in the respective capacitor 13, 15 can be determined from the change of the capacitance of at least one of the capacitors 13, 15. The electrical charge of the toner particles of the toner particle layer 38 and the charge or the potential of the photoconductor belt 16 have an effect on the measurement signal Ux and can be determined by the evaluation unit 28 on the basis of the curve of the sampled measurement values, i.e. of the measurement signal Ux. In particular, the electrical charge of the toner particles of the toner particle layer 38 can be determined when the toner quantity or the layer thickness of the toner mark in the detection region is known.

Figure 2:
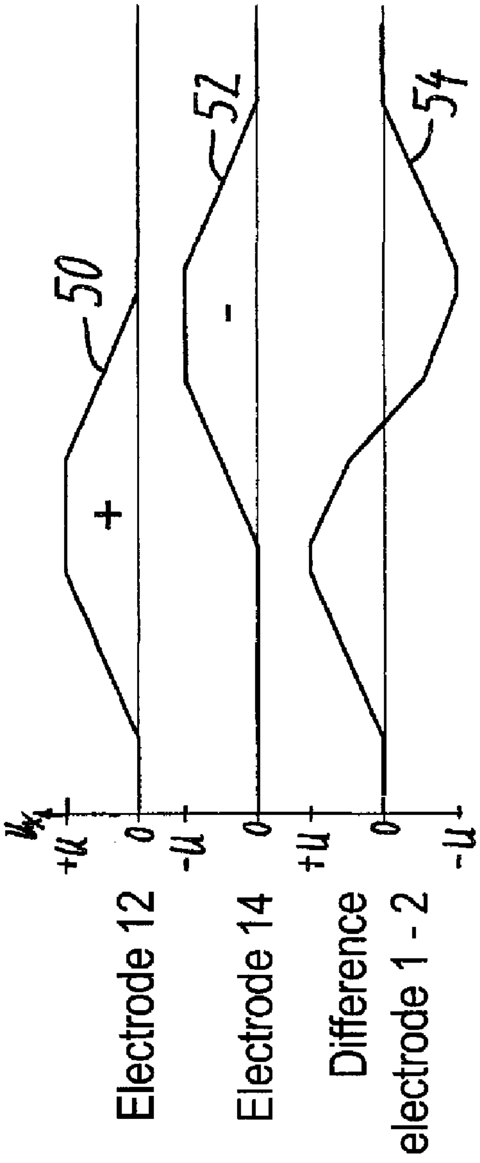
FIG. 2 is a diagram with the signal curves determined by the capacitive measurement arrangement according to FIG. 1 upon transport of the toner mark after a current-voltage conversion of the measurement signal.

A diagram with signal curves 50, 52, 54 of measurement values scanned with the aid of the measurement arrangement 10 according to FIG. 1 is shown in FIG. 2, which measurement values have been sampled in a first operating mode to determine the layer thickness of the toner particle layer 38 of the toner mark 39. The signal curves 50, 52, 54 shown in FIG. 2 indicate a theoretical signal curve of the respective measurement signal. Due to the measurement precision of the measurement arrangement 10 and disruptive influences and variances of the layer thickness of the toner particle layer 38, the actual signal curve deviates from the theoretical signal curve.

The signal curve 50 shows the proportion of the total signal curve 54 that would be produced by the charge carrier discharged by the first electrode 12 in the second switch state of the switching unit 26 if only this first electrode 12 were connected with the input of the current-voltage converter 27 in the second switch state. In the same way the signal curve 52 indicates the proportion of the total signal curve 54 that would be produced by the charge carries transferred to the current-voltage converter by the second electrode 14 in the second switch state if only this second electrode 14 were connected with the current-voltage converter 27 in the second switch state. However, due to the electrical connection between the two electrodes 12, 14 or due to the short of the two electrodes 12, 14 in the second switch state, the difference of the signal curves 50, 52 is generated, whereby the total signal curve 54 results that is output by the current-voltage converter 27 as a measurement signal Ux. The signal curves 50, 52, 54 of the output voltage Ux (measurement signal) output by the current-voltage converter 27 essentially correspond to the signal curve of the current I supplied to the current-voltage converter 27. The signal curves 50, 52, 54 shown in FIG. 2 are generated when the toner particle layer 38 is directed between the electrodes 12, 14 and the counter-electrode and given a movement of the photoconductor belt 16 in the direction of the arrow P1.

Given such a movement of the photoconductor belt 16, the toner mark 39 is first introduced into the detection region between the electrode 12 and the photoconductor belt 16, wherein the proportion of the detection region that is covered by the toner mark 39 continuously increases due to the continuous transport movement of the photoconductor belt 16 until a maximum is reached. For example, the maximum can be reached when the toner mark 39 covers the entire detection region. The toner mark 39 is then continuously conveyed out of the detection region of the electrode 12 via an additional movement of the photoconductor belt 16 in the transport direction P1, whereby the voltage Ux output by the current-voltage converter 27 drops again.

An identical signal curve 52 results via the transport of the toner mark 39 into the detection region of the electrode 14 and the subsequent transportation of the toner mark 39 out of the detection region of the electrode 14. At least in the first operating mode it is advantageous when the voltage sources 42, 44 have different voltages or, respectively, a different polarity in relation to the reference potential, wherein the voltage source 42 generates a positive voltage and the voltage source 44 generates a negative voltage in relation to the reference potential 18. Due to the difference calculation of the signal curves 50, 52, the signal curve 54 results that the current-voltage converter 27 supplies as a signal Ux to the evaluation unit 28. If the voltage sources 42, 44 have different polarities, the signal curves 50, 52 are added. Alternatively, the signal curves 50, 52 can be subtracted when the voltage sources 42, 44 have the same polarity.

Figure 3:
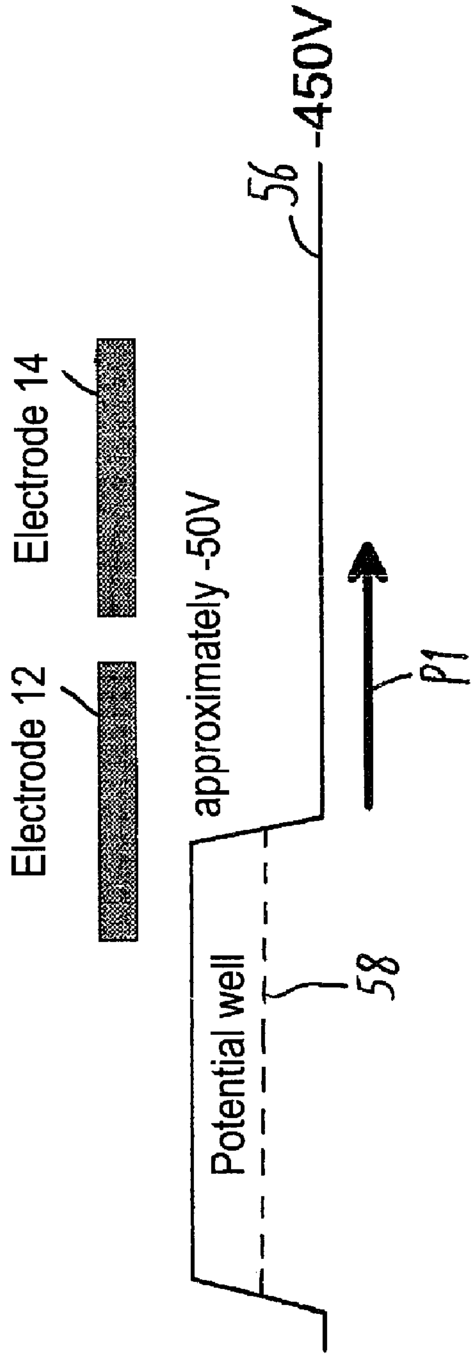
FIG. 3 is a schematic representation of the electrodes of the measurement arrangement according to FIG. 1, and the different potentials of the photoconductor belt in charged and discharged regions as well as in a region inked with toner.

The electrodes 12 and 14 of the measurement arrangement 10 according to FIG. 1 and the potential curve of a charged and a discharged region of the photoconductor belt 16 are schematically shown in FIG. 3. When the photoconductor belt 16 is driven in the direction of the arrow P1, the charged region and the discharged region of the photoconductor belt 16 are directed past the electrodes 12, 14 as this is shown by way of example via the arrangement of the electrodes and the potential curve for a detection position in FIG. 3.

As is already explained in connection with FIG. 1, the photoconductor belt 16 is charged to a potential of −450 V (for example) in relation to the reference potential of the printer or copier. The regions to be inked with toner are discharged to approximately −50 V in the recording method of the exemplary embodiment. The toner particles provided by the developer unit to ink the regions to be inked are charged to a potential of −100 to −200 V, for example. A region of the photoconductor belt 16 that is inked with toner particles, to be inked or discharged thereby has a potential (dependent on the electrical charge of the toner particles) in the range from −150 V to −250 V, for example. The signal curve of the inked region of the potential that deviates from the signal curve 56 of the region to be inked is shown with the aid of a dashed line 58.

The desired values for the potentials are in particular affected and/or established via preset parameters to control and regulate the electrographic image generation process. In particular, the value of the potential to which the photoconductor belt 16 is charged and the value of the potential to which the regions of the photoconductor belt 16 that are to be inked are discharged can be changed. The changes respectively affect the potential changed by the electrically charged toner particles in the regions of the photoconductor belt 16 that are inked with toner particles.

Both the layer thickness and the potential of the photoconductor 16 and the electrical charge of the toner particles of the toner layer 38 can be determined with the aid of the measurement arrangement 10 according to FIG. 1, i.e. with such a capacitive measurement arrangement or a capacitive measurement arrangement of similar design. In particular, the potential difference between the charged regions of the photoconductor belt 16 and the discharged regions of the photoconductor belt 16 and between the charged regions of the photoconductor belt 16 and the regions of the photoconductor belt 16 inked with toner particles is determined by the measurement arrangement 10. The photoconductor belt 16 can be discharged to a desired potential via a different light intensity and/or via a different effective light duration.

It is advantageous to provide a calibration mode to calibrate the measurement arrangement 10 for the second operating mode, in which calibration mode multiple regions discharged to different potentials are generated that are detected in succession with the aid of the measurement arrangement 10 according to FIG. 1. Both the potential differences between the charged regions of the photoconductor 16 and a respective discharged region of the photoconductor 16 and/or the potential differences between the different discharged regions can thereby be determined. The discharged regions of the photoconductor 16 or the charged regions inked with toner particles are also designated as a potential well due to their low potential.

Figure 4:
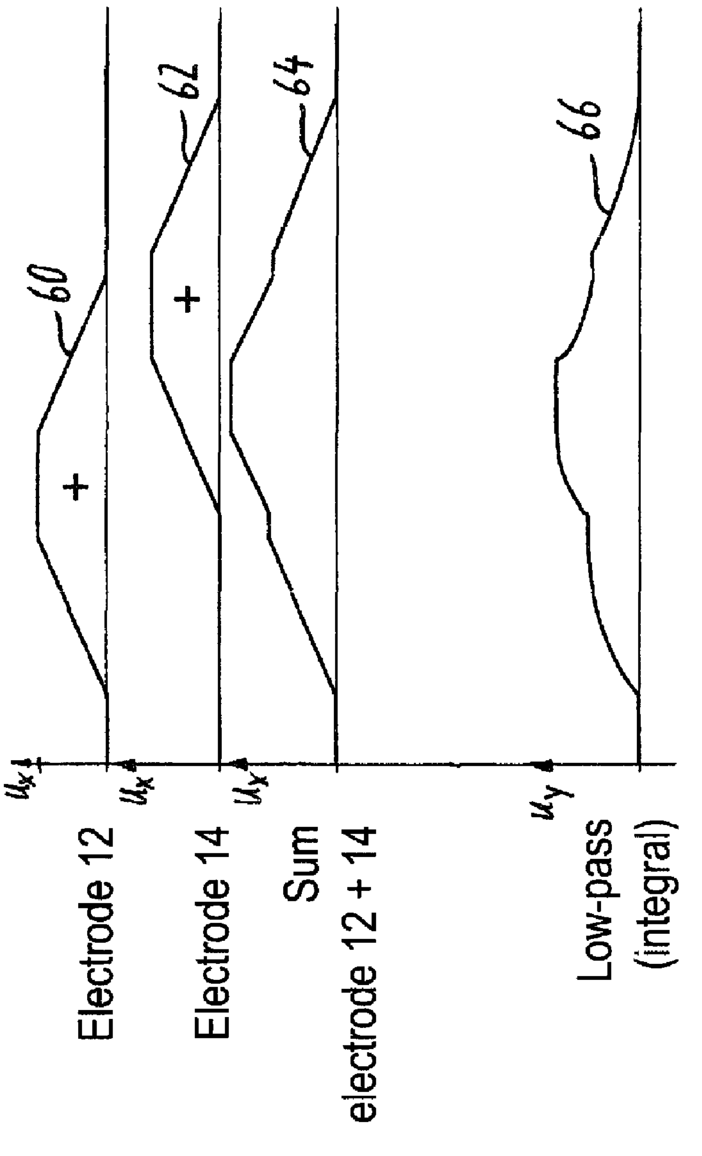
FIG. 4 is a diagram with the signal curves of the measurement arrangement according to FIG. 1 upon direction of a discharged region arranged between two charged regions past the first and second electrode of the measurement arrangement according to FIG. 1 after a current-voltage conversion of the measurement signal.

The signal curves 60, 62, 64, 66 upon operation of the measurement arrangement 10 in the second operating mode are shown in FIG. 4. In the second operating mode, the voltage sources 44, 46 generate the same voltage; the first and the second voltage sources advantageously respectively generate a positive voltage in relation to the reference potential 18 of the printer or copier. Both capacitors 13, 15 in the first switch state of the switches 46, 48 are thereby electrically connected with the same charge voltage.

The sum of the charges of the capacitors 13, 15 that produce the current I that flows between the electrodes 12, 14 and the current-voltage converter 27 is formed by the switching of the switches 46, 48 over into the second switch state. Given a movement of the photoconductor belt 16 in the direction P1, the signal curve 60 is generated with the potential well is directed past the first electrode 12. The signal curve 62 is generated when the potential well is directed past the end 14. The signal curves 60, 62 are shown only for clarification of the resulting signal curve 64, in the same manner as the signal curves 50, 52. The resulting signal curve is output by the current-voltage converter 27 as a measurement signal Ux when the potential well is directed successively past the first electrode 12 and subsequently past the electrode 14.

The electrodes 12, 14 have only a relative low lateral distance from one another that is shorter than the length of the discharged region on the generated surface 40 of the photoconductor belt 16. It results from this that a current I is supplied to the current-voltage converter every time the switch 46, 48 is switched over into the second switch state, which current I is converted into a voltage Ux. A signal curve 64 of the voltage Ux that, or which, is output as a measurement signal supplied to the evaluation unit 28 thereby results, which signal curve 64 is generated from a plurality of current sample values. In particular, the potential of the electrical charge of the toner particles can be determined by the evaluation unit 28 with the aid of the determined maximum voltage of the signal curve Ux and the rise of the signal curve Ux in the individual time periods.

Due to disruptive influences, individual sample values can significantly deviate from the correct signal curve, whereby an incorrect measurement value detection could result. It is advantageous to combine the current-voltage converter 27 with a low-pass filter and/or an integrating circuit, or to arrange this/these downstream. The low-pass filter or the integrating circuit can also be arranged in the evaluation unit 28. The signal curve generated with the aid of a low-pass filter from the signal curve 64 is shown by way of example in FIG. 4 as a signal curve 66.

Figure 5:
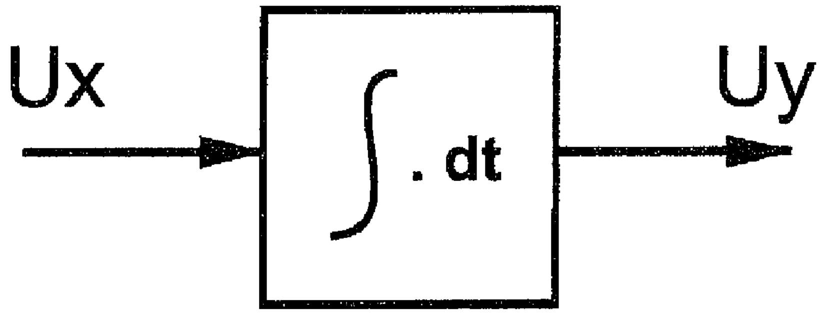
FIG. 5 shows an integrating circuit to integrate the measurement signal output by a current-voltage converter.

An integrating circuit to integrate the signal Ux output by the current-voltage converter 27 is shown by way of example in FIG. 5. The integrated signal output by the integrating circuit is designed with Uy in FIG. 5. The signal Uy results according to the following equation:

$$Uy(t) \sim \int Ux(t)dt = \int k \cdot i(t)dt = \int k \cdot C\frac{dPot}{dt}dt = k \cdot C \cdot Pot$$

Pot=the voltage that is applied to the capacitor (potential of the surface),

C=the capacitance of the capacitors 13, 15 k=a constant factor i(t)=the displacement current of the capacitor,

Ux=the output voltage of the current-voltage converter, and

Uy=the received measurement signal after the integration.

The displacement current i(t) is the current produced by the charges stored in the capacitors 13, 15, which is designated with I in FIG. 1. Every time the crossover switches 46, 48 are switched over into the second switch state, this displacement current is generated again. The charge of the capacitors 13, 15 and the displacement current dependent on the charge is dependent on the surface potential of the photoconductor belt 16 and on the electrically charged toner particles possibly arranged on said photoconductor belt 16. The displacement current is repeatedly generated and detected via the sampling processes. The repeatedly detected displacement currents can be integrated with the aid of the integration of the measurement signal after the current-voltage conversion, whereby the current signal or, respectively, the measurement signal can be multiplied.

Given a mere detection of different surface potentials of the photoconductor belt 16, the capacitances of the capacitors 13, 15 are constant. Given determination of the electrical charge of the toner particles, a constant, known layer thickness and thus a known capacitance change of the capacitor or the capacitors 13, 15 is assumed that is taken into account in the determination of the electrical charge of the toner particles by the evaluation unit 28. Given the layer thickness measurement in the first operating mode, the measurement signal I or Ux is likewise proportional to the layer thickness. However, the measurement signal is thereby caused by the change of the capacitance of the respective capacitor 13, 15 due to the transportation of the toner particle layer 38 into or out from since the dielectric in the respective capacitor 13, 15 and thus the charge of the capacitor changes due to the toner particle layer. The charge Q stored in the respective capacitor 13, 15 results from the following equation:

$$Q=U*C$$

Given an identical charge voltage U, the respective capacitor 13, 15 stores a charge corresponding to the capacitance that produces a discharge current flow (displacement current) upon discharging. The sum of the charges Q of the first capacitor 13 and of the second capacitor 15 produces a current flow I to the current-voltage converter 27. Assuming the curve of the current flow I or of the measurement signal Ux, the evaluation unit 28 determines as a measurement result the charge potential of the photoconductor 16; the discharge potential of the photoconductor 16; the layer thickness of the toner particle layer 38; and/or the electrical charge of the toner particles of the toner particle layer 38. For this the evaluation unit 28 in particular analyzes the qualitative curve of the measurement signal and the chronological occurrence of specific signal changes and absolute signal differences. Given an integration of the signal curve Ux, the problem occurs that the integrator does not possess a defined zero point. The output signal Uy of the integrator is non-transiently distorted by a temporary leak current. Therefore an integrator should be used in which the integrated value Uy can be reset or erased.

Figure 6:
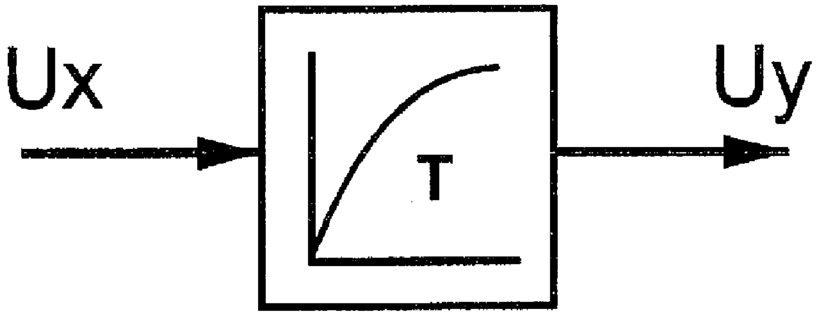
FIG. 6 illustrates a low-pass filter to filter the measurement signal output by the current-voltage converter, wherein the low-pass filter is used as an alternative or in addition to the integrating circuit according to FIG. 5.

As an alternative to the integrator shown in FIG. 5, the low-pass filter shown in FIG. 6 can be used that in particular has a large time constant. Due to the large time constant, the low-pass filter acts like an integrator, with the difference that the signal Uy is always returned again to an initial value (in particular to "0"), at least one larger measurement pauses.

Figure 7:
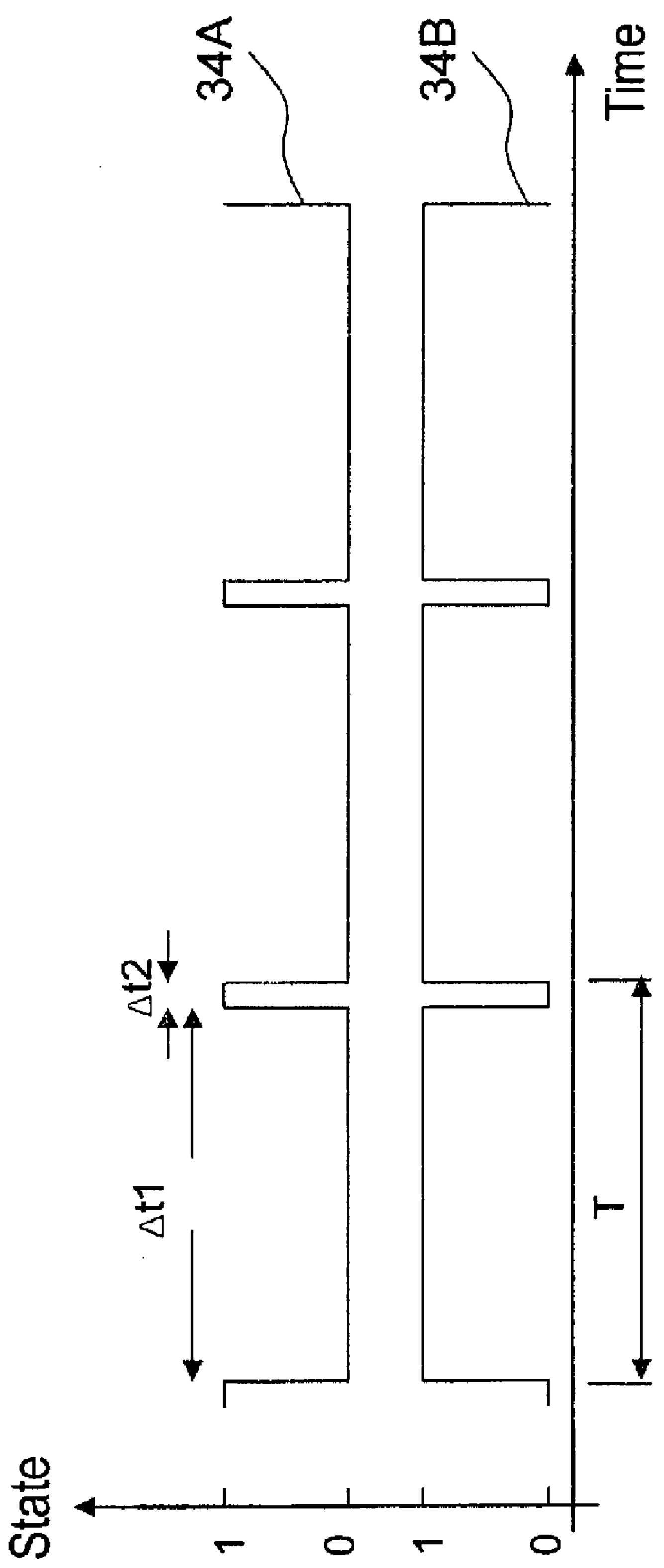
FIG. 7 is a diagram in which the switching signals to control the crossover switch of the measurement arrangement according to FIG. 1 are shown for a first operating mode to determine the layer thickness of the toner mark and for a second operating mode to determine the electrical charge of the toner particles.

In FIG. 7, the curve of the signal 34 to activate the switches 46, 48 is shown as a curve 34A in the first operating mode and as a curve 34B in the second operating mode. The electrodes 12, 14 are connected via the crossover switches 46, 48 with the current-voltage converter 27 when the signal 34 has the signal state 1 in the shown curves 34A and 34B. In the first operating mode, the switches are connected with the voltage sources 42, 44 for the time period Δt1; in the second operating mode the switches are connected with the current-voltage converter 27 for a time period Δt2. In the second operating mode, the crossover switches 46, 48 connect the electrodes 12, 14 with the voltage sources 42, 44 for a respective time period Δt2 and with the current-voltage converter 27 for a respective time period Δt1. In a first operating mode the crossover switches 46, 48 are thus activated with an inverted duty factor (i.e. with an inverted pulse-pause ratio) relative to the second operating mode. The duty factor thereby indicates the ratio of the time duration Δt1 or Δt2 of the activated state (pulse duration) to the total time duration T of the activated and deactivated state, wherein T=Δt1+Δt2. The total time duration T is thus the time duration T of a switching cycle. In the activated state, the crossover switches 46, 48 connect the electrodes 12, 14 with the current-voltage converter 27, and in the deactivated state the crossover switches 46, 48 connect the electrodes 12, 14 with the voltage sources 42, 44. In the curve 34A the duty factor=Δt1/T, i.e. 0.1, and in the curve 34B the duty factor=Δt2/T, i.e. 0.9.

With the aid of the described procedure, the measurement arrangement 10 can be used both as a toner mark sensor to determine the layer thickness and/or the degree of inking of a toner mark 39, and for potential measurement and to measure the electrical charge of the toner particles. As shown in FIG. 7, a duty factor of <0.5 is selected for potential measurement and to determine the electrical charge of the toner particles, and a duty factor of >0.5 is selected for layer thickness measurement. In the potential measurement the electrodes 12, 14 of the capacitors 13, 15 are thereby connected with the input of the current-voltage transmission/reception diplexer 27 for a relatively long time period.

In a first operating mode, a relatively low duty factor is reasonable, advantageously in a range between 0.001 and 0.2, and a relatively high duty factor is reasonable in the second operating mode, advantageously in a range from 0.8 to 0.999. A different, significantly lower or higher duty factor can also be selected if a correspondingly high switching frequency f1, f2 is possible with the crossover switches 46, 48 given a sufficiently precise sampling of the signal curve.

The preferred embodiment can also be implemented with capacitive measurement arrangements that have only one capacitor 13, 15. Then it is not the difference or the sum of the charge of the capacitors that is determined; rather, the charge of only the one capacitor is used for evaluation.

In a second operating mode it is also possible that the electrodes 12, 14 (or, given capacitive measurement arrangements with only one electrode, only the one electrode) is connected over a long term with the input of the current-voltage converter 27. The change of the potential then causes a change of the current I that flows between the electrode/the electrodes 12, 14 and the current-voltage converter 27. Both the layer thickness (and therefore the toner quantity) of the toner mark 39 and the potential or the electrical charge of the toner particles used for inking regions of the photoconductor 16 that are to be inked can be detected with the same sensor (measurement arrangement 10) via the preferred embodiment. Different types of measurements can thereby be implemented with only one sensor. This is cost-effective and calls for only a relatively small space requirement in the printer or copier.

The evaluation unit 28 can determine the charge state of the toner particles in the developer unit in a simple manner with the aid of the determined electrical charge of the toner particles. In particular, it can be determined whether the electrical charge of the toner particles is sufficient for a qualitatively high-grade image generation process. In the event that it is necessary, via activation of drive elements of the developer unit a triboelectrical charging of the toner particles in the developer unit can be implemented via a mechanical mixing process of a two-component mixture comprising carrier particles and toner particles. Alternatively or additionally, toner can be discharged from the developer unit so that new toner particles that have better triboelectrical charge properties are resupplied into the developer unit from a toner reservoir. For example, print images inked over their entire surface can be generated and transfer-printed onto a substrate material to discharge a large quantity of toner from the developer unit. This substrate material is then discharged as spoilage.

Alternatively or additionally, image generation parameters of the printer or copier can be correspondingly adapted in order to at least partially compensate for the effects of a charge state of the toner particles that deviates from a desired state.

The preferred embodiment has been described by way of example in connection with a photoconductor belt 16. Instead of the photoconductor belt 16, however, a different intermediate image carrier (in particular a photoconductor drum, a transfer belt and/or a transfer drum) can also be used.

The charge of the generated surface of the intermediate image carrier as well as the electrical potential of this generated surface in the sense of the preferred embodiment designate the surface charge and/or the charge of the coating layer of the intermediate image carrier.

The preferred embodiment can advantageously be used in electrographic print or copying devices whose recording methods for image generation are in particular based on the electrophotographic, magnetographic or ionographic recording principle. The printing or copying devices can also use a recording method for image generation in which an image recording medium is directly or indirectly electrically activated point-by-point. However, the preferred embodiment is not limited to such electrographic printing or copying devices.

Although preferred exemplary embodiments are shown and described in detail in the drawings and in the preceding specification, these should be viewed purely as examples and not as limiting the invention. It is noted that only preferred exemplary embodiments are presented and described, and all variations and modifications that presently and in the future lie within the protective scope of the invention should be protected.

The invention claimed is:

1. A system to detect an electrical charge and a layer thickness of a layer of toner particles in a printer or copier, comprising:

a measurement arrangement that has a first electrode and at least one second electrode situated adjacent the first electrode;

an endless intermediate image carrier on a generated surface of which a toner image can be generated;

a drive unit that drives the intermediate image carrier so that its generated surface is directed in a revolving manner past the first and the second electrodes situated opposite the generated surface;

an evaluation unit electrically connected with the first electrode and the second electrode;

the evaluation unit detecting an electrical current flowing between the first and second electrodes and the evaluation unit;

the evaluation unit determining the layer thickness of the layer of toner particles on the intermediate image carrier arranged in a detection region at the intermediate image carrier in a first measurement procedure with aid of the detected current; and the same evaluation unit also determining the electrical charge of the layer of toner particles in the detection region of the intermediate image carrier in a second measurement procedure with aid of the detected current.

2. A system according to claim 1 wherein the evaluation unit detects a curve of the current flow caused due to an electrical charge or due to a change of the electrical charge of the generated surface of the intermediate image carrier, or due to the charge of the toner particles arranged in the detection region or a change of the electrical charge of the toner particles arranged in the detection region.

3. A system according to claim 1 wherein the evaluation unit determines a displacement current caused by the electrical charge of the intermediate image carrier in the detection region or a displacement current caused by the charge of the toner particles present in the detection region.

4. A system according to claim 1 wherein the evaluation unit determines the charge with aid of the determined current flow, wherein the charge is dependent on the charge of the generated surface of the intermediate image carrier that is arranged in the detection region or of the charge of the toner particles present in the detection region.

5. A system according to claim 1 wherein the evaluation unit determines a sum of the detected current over a preset time period and outputs this as a measure of the electrical charge of the generated surface of the intermediate image carrier or of the charge of the toner particles.

6. A system according to claim 1 wherein a photoconductor whose generated surface can be charged to a first potential and can be discharged to a second potential per region with aid of a character generator serves as the intermediate image carrier.

7. A system according to claim 6 wherein at least one developer unit inks the at least one discharged or the at least one charged region with a layer of electrically charged toner particles, wherein at least one charged region of the photoconductor and one region of the photoconductor inked with toner particles, or at least one discharged region of the photoconductor and one region of the photoconductor inked with toner particles pass the detection region via the driving of said photoconductor.

8. A system according to claim 6 wherein the evaluation unit determines the charge of the toner particles of the inked regions with aid of the detected current, determines a layer thickness of the generated toner particle layer, or determines a potential difference between the discharged region and the charged region.

9. A system according to claim 1 wherein at least one region inked with toner particles can be generated on the intermediate image carrier with aid of an image generation unit, and at least one region of the intermediate image carrier inked with toner particles and one region of the intermediate image carrier that is not inked with toner, or a region of the intermediate image carrier that is not inked with toner particles and a region of the intermediate image carrier that is inked with toner particles, pass the detection region in succession due to the drive of the intermediate image carrier.

10. A system according to claim 1 wherein the evaluation unit comprises at least one low-pass filter or an integrating circuit, and wherein a sum of the currents determined in multiple detection cycles is formed.

11. A system according to claim 1 wherein the evaluation unit repeatedly determines the current at sample points in time, and the evaluation unit associates a first portion of measurement values with the first measurement procedure and a second portion of measurement values with the second measurement procedure.

12. A system according to claim 1 wherein the measurement arrangement comprise at least one capacitive sensor that has two capacitors arranged in series in a revolution direction of the intermediate image carrier.

13. A system of claim 1 wherein the first and the second electrodes form respective first and second capacitors and in the first measurement procedure a charge difference of the two capacitors is determined by the evaluation unit to determine the electrical charge of the layer of toner particles and then in the second measurement procedure a charge sum of the two capacitors is determined to determine the charge of the layer of toner particles.

14. A system to detect an electrical charge and a layer thickness of a layer of toner particles in a printer or copier, comprising:

an endless intermediate image carrier on a generated surface of which a toner image is generated;

a measurement arrangement having at least one electrode opposite said generated surface of said endless intermediate image carrier in a detection region at the intermediate image carrier;

a drive unit that drives the intermediate carrier so that its generated surface is directed in a revolving manner past the at least one electrode at the detection region;

an evaluation unit electrically connected with the at least one first electrode;

the evaluation unit detecting an electrical current flowing between the at least one electrode and the evaluation unit; and the evaluation unit determining the layer thickness of the layer of toner particles on the intermediate image carrier at the detection region in a first measurement procedure and the same evaluation unit also determining the electrical charge of the layer of toner particles at the detection region of the intermediate image carrier in a second measurement procedure.

15. A system to detect an electrical charge and a layer thickness of a layer of toner particles in a printer or copier, comprising:

an endless intermediate image carrier on a generated surface of which a toner image is generated;

a measurement arrangement having two electrodes opposite said generated surface of said endless intermediate image carrier in a detection region at the intermediate image carrier;

a drive unit that drives the intermediate carrier so that its generated surface is directed in a revolving manner past the two electrodes at the detection region;

an evaluation unit electrically connected with the two electrodes; and the evaluation unit determining the layer thickness of the layer of toner particles on the intermediate image carrier at the detection region in a first measurement procedure and the same evaluation unit also determining the electrical charge of the layer of toner particles at the detection region of the intermediate image carrier in a second measurement procedure.

* * * * *